Aug. 27, 1968 E. DAVIES 3,399,356
INTERSTAGE ATTENUATOR COUPLING NETWORK FOR
TUNED EMITTER AMPLIFIERS
Filed Jan. 17, 1966

INVENTOR
Eric Davies
BY Baldwin & Wight
ATTORNEY 3,399,356

INTERSTAGE ATTENUATOR COUPLING NETWORK FOR TUNED EMITTER AMPLIFIERS

Eric Davies, Danbury, England, assignor to The Marconi Company Limited, London, England, a British company Filed Jan. 17, 1966, Ser. No. 520,932
Claims priority, application Great Britain, Feb. 8, 1965, 5,463/65
4 Claims. (Cl. 330—21)

Figure 1:
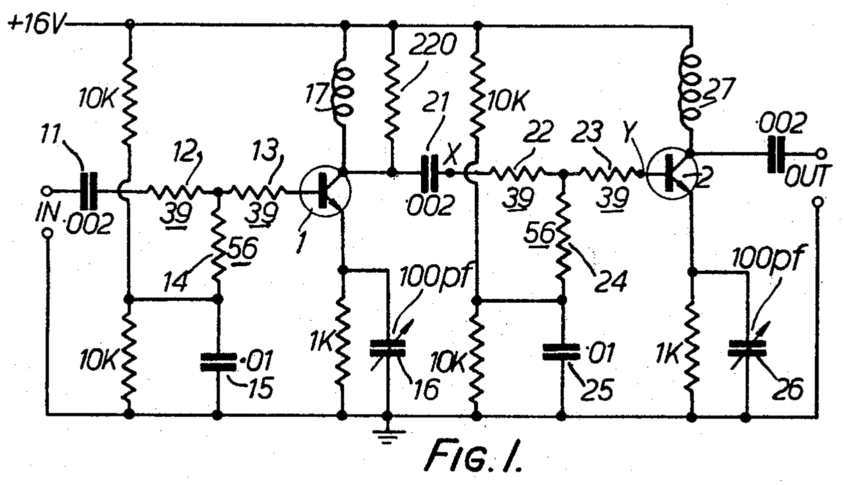

This invention relates to transistor amplifiers and more specifically to transistor amplifiers of the tuned emitter type, i.e., of the type in which a transistor stage is tuned to the desired operating frequency by a series resonant circuit in the emitter circuit thereof. In a transistor stage of this type the amplification of the stage at the frequency of resonance (at which, of course, the series resonant circuit presents low impedance), approximates to the ratio of the collector resistance to the effective resistance of the resonant circuit. Off resonance the emitter circuit impedance increases and the gain reduces. In the case of amplifiers designed for amplification at frequencies which are not very high the series resonant circuit usually consists of an actual wound inductor in series with a tuning condenser but, when very high frequencies of the order of tens of mc./s. are in question, the inductance of the series resonant circuit is provided by that of the emitter lead in which a tuning condenser is inserted.

Satisfactory results have been achieved with known single stage tuned emitter transistor amplifiers even at quite high frequencies of the order of 20 to 60 mc./s. but difficulty is experienced and unsatisfactory operation is obtained when it is sought to connect two such stages in cascade, such serious interaction occurring between the two emitter tuned circuits in the two successive stages as often to render the arrangement inoperable altogether. It is believed, and experiment indicates, that the cause of this trouble is the manifestation of negative input impedance at the base of the second transistor of a pair and the presentation of an effectively low output impedance at the frequency of resonance.

The present invention seeks to provide improved cascaded stage tuned emitter transistor amplifiers which can be designed to operate in stable and satisfactory manner at very high frequencies of the order of tens of mc./s.

According to this invention a transistor amplifier comprising at least two cascaded tuned emitter stages includes an attenuator in the coupling circuit between the collector of the transistor of the first of said stages and the base of the transistor of the second of said stages, said attenuator being such that, at the frequency of resonance, the amplitude at the base end of the attenuator is substantially equal to or less than the amplitude at the collector end.

Preferably the attenuator is constituted by a T-network of resistances.

In one embodiment of the invention the attenuator is a T-network with the "cross-piece" of the T connected, as respects high frequency, between the collector of the first of the two transistors and the base of the second, the lower end of the "stem" of the T being taken, as respects high frequency to the ground point of the amplifier. Alternatively a T-network may be connected with its "cross piece" between the base of the second of the transistors and one end of the secondary of a transformer the primary of which is in the collector circuit of the first transistor, the lower end of the "stem" of the T being taken to the other end of said secondary.

The bandwidth is a function of the tuned circuit Q value and accordingly an increased bandwidth can be obtained (at the expense of reduced gain) by increasing the impedance of the attenuator and, conversely, increased gain and reduced bandwidth can be obtained by decreasing said impedance.

The invention is illustrated in the accompanying drawings which show three embodiments so far as is necessary to an understanding thereof. In the drawings certain practical values of components are shown. These are, however, by way of example only, and in no sense limiting. The values shown are suitable for an amplifier for operation of about 60 mc./s. to give about 40 db gain. Like references denote like parts in all three figures.

In FIGURE 1 the input terminals of the amplifier are shown at IN and the output terminals at OUT. The amplifier has two stages, the first including transistor 1 and the second including transistor 2. The input base circuit of transistor 1 includes an input coupling capacitor 11 and two resistances 12, 13 which constitute the "cross piece" of a T-network the "stem" of which is constituted by the resistance 14. The lower end of this resistance 14 is taken to earth, as respects high frequency, through condenser 15. The emitter circuit of transistor 1 is tuned by a condenser 16 forming part of a series resonant circuit the inductance of which is provided by the emitter lead itself. 17 is a high frequency choke.

The circuit of the second stage is similar, the circuit elements 21 to 27 in the second stage corresponding respectively to the elements 11 to 17 in the first stage. The attenuator network 22, 23, 24 provided by this invention, acts as an isolator pad to prevent inter-action between the two emitter tuned circuits, the component values of this pad being correct when the signal amplitudes at the points marked X and Y are equal. The optimum collector load resistance for an emitter tuned transistor of a modern epitaxial type is in the neighbourhood of 75 ohms but, from the point of view of securing stability of the two cascaded transistors, the criterion is that the amplitude at Y should be equal to or a little less than that at X.

The input impedance of each stage is determined by the resistance values in the attenuator thereof and the bandwidth is a function of the impedance at the output end of said attenuator. The attenuator in the base circuit of the first stage provides a definite input impedance for said stage. Such a definite input impedance is often required, e.g., where the amplifier is required to match a co-axial line from which it is fed.

Figure 2:
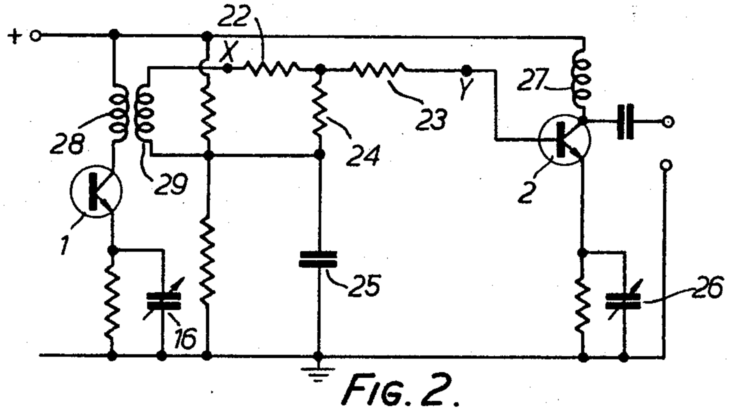

In some cases the component values of an attenuator, as dictated by a particular required bandwidth, may result in undesirably low gain because of poor impedance matching. This difficulty can be met by providing a broad-band impedance matching transformer, as shown at 28, 29 in FIGURE 2, to couple the collector circuit of the first stage to the circuit including the attenuator of the second stage.

Figure 3:
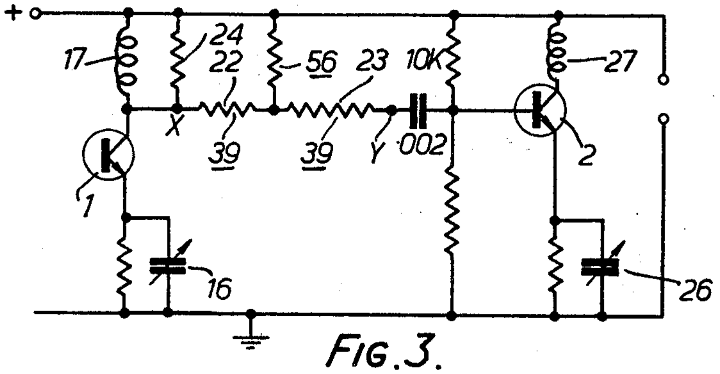

Obviously the attenuator can be on either side of hte inter-stage coupling condenser. FIGURE 3 shows an arrangement in which the coupling condenser is after the attenuator and in which, incidentally, the "stem" of the T is returned to the positive supply line.

The invention is not limited to the particular circuits shown and may be applied to cascaded stage emitter tuned amplifiers of more complex nature (e.g., those including integrated circuits) and forms of attenuator other than those shown may be used.

I claim:

1. A transistor amplifier comprising at least two cascaded tuned emitter stages with an attenuator in the coupling circuit between the collector of the transistor of the first of said stages and the base of the transistor of the second of said stages, said attenuator being such that, at the frequency of resonance, the amplitude at the base end of the attenuator is substantially equal to or less than the amplitude at the collector end.

2. An amplifier as claimed in claim 1 wherein the attenuator is constituted by a T-network of resistances.

3. An amplifier as claimed in claim 2 wherein the attenuator is a T-network with the "cross-piece" of the T connected, as respects high frequency, between the collector of the first of the two transistors and the base of the second, the lower end of the "stem" of the T being taken, as respects high frequency to the ground point of the amplifier.

4. An amplifier as claimed in claim 2 wherein the attenuator is connected with its "cross piece" between the base of the second of the transistors and one end of the secondary of a transformer the primary of which is in the collector circuit of the first transistor, the lower end of the "stem" of the T being taken to the other end of said secondary.

No references cited.

ROY LAKE, *Primary Examiner.*

S. H. GRIMM, *Assistant Examiner.*